United States Patent [19]

Abrams et al.

[11] Patent Number: 4,616,329
[45] Date of Patent: Oct. 7, 1986

[54] SELF-CALIBRATING ADAPTIVE RANGING APPARATUS AND METHOD

[75] Inventors: David Abrams, Somerville; Raul Curbelo, Lexington; R. Brough Turner, Newton, all of Mass.

[73] Assignee: Bio-Rad Laboratories, Inc., Richmond, Calif.

[21] Appl. No.: 526,663

[22] Filed: Aug. 26, 1983

[51] Int. Cl.[4] .................. G05B 1/00; H03K 13/02
[52] U.S. Cl. .................. 364/571; 340/347 CC; 340/347 AD
[58] Field of Search ............. 364/571; 340/347 AD, 340/347 CC, 347 M, 347 DA

[56] References Cited

U.S. PATENT DOCUMENTS

| | | | |
|---|---|---|---|
| 3,750,142 | 7/1973 | Barnes et al. | 340/347 CC |
| 3,886,451 | 5/1975 | Chu et al. | 364/571 |
| 3,918,048 | 11/1975 | Omura | 340/347 CC |
| 4,031,533 | 6/1977 | Neumann | 340/347 CC |
| 4,198,677 | 4/1980 | Brunner et al. | 340/347 CC |
| 4,338,589 | 7/1982 | Engel et al. | 340/347 CC |
| 4,345,241 | 8/1982 | Takeuchi et al. | 340/347 AD |
| 4,380,005 | 4/1983 | Debord et al. | 340/347 AD |
| 4,399,426 | 8/1983 | Tan | 364/571 |

FOREIGN PATENT DOCUMENTS

| | | | |
|---|---|---|---|
| 0100763 | 8/1979 | Japan | 340/347 CC |
| 0149530 | 11/1980 | Japan | 340/347 CC |

Primary Examiner—Parshotam S. Lall
Attorney, Agent, or Firm—Schiller & Pandiscio

[57] ABSTRACT

Apparatus and method for calibrating an adaptive ranging A/D converter wherein a noise having known statistical properties is deliberately superposed on the reference DC signals used to calibrate the gain-ranging amplifier. The amplitude of the noise is chosen to be greater than at least one, and preferably several, least significant digits of the A/D converter at the lowest anticipated gain, yet preferably less than half the counting range of the converter at the highest gain. The reference DC signal levels are chosen to be spaced from the minimum and maximum count of the A/D at the lowest and highest anticipated gains by better than half the noise amplitude. A time average of a series of measurements of the noisy reference signals as amplified and digitized by the system are obtained. The statistical properties of the noise generator permits the system output corresponding to the reference signals to be determined to a greater accuracy than the resolution of the A/D, thereby allowing the gain and offset of the gain-ranging amplifier to be determined with greater precision than is possible by injecting noiseless DC signals alone.

14 Claims, 1 Drawing Figure

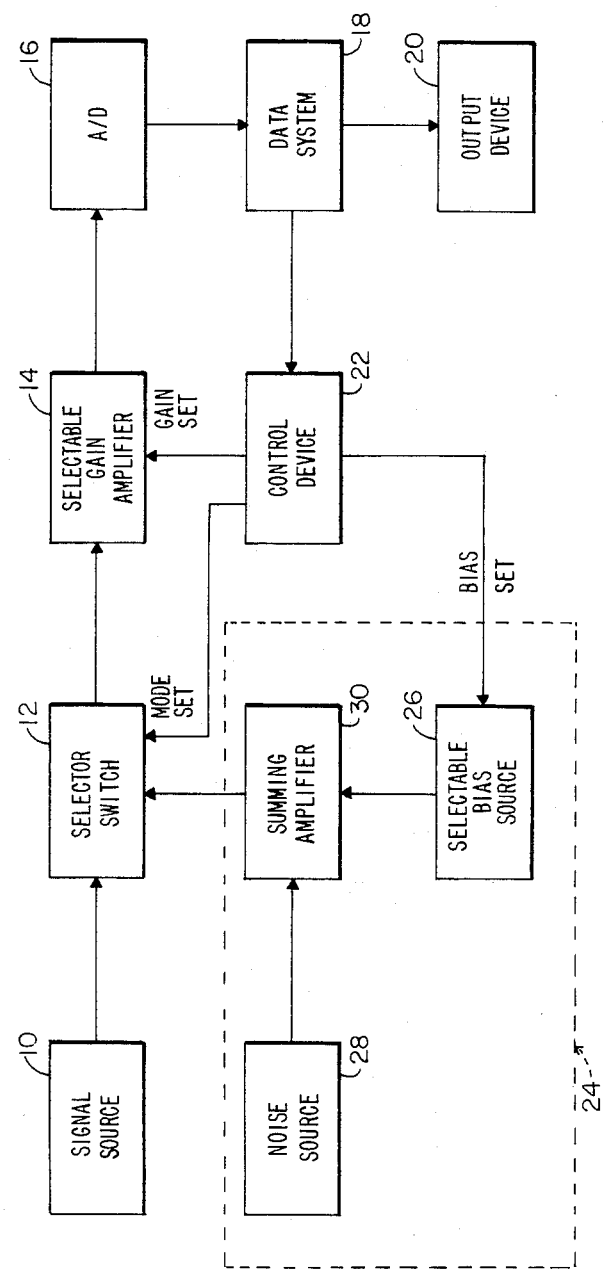

SELF-CALIBRATING ADAPTIVE RANGING APPARATUS AND METHOD

BACKGROUND OF THE INVENTION

The present invention relates to the field of combined analog and digital signal processing, and more specifically to an analog-to-digital (A/D) system incorporating a self-calibrating gain-ranging amplifier connected to an A/D converter.

It is well known to convert an analog-type signal to a digital signal for purposes of more reliable or convenient data transmission, storage, or manipulation. A frequent expedient, particularly when the analog signal may vary over a large range of values, is to employ a selectable gain (or "gain-ranging") amplifier for selectively amplifying or attenuating the analog signal just prior to digitizing the signal with the A/D converter. The resulting digital output of the A/D converter may then be divided (or multiplied) by the gain (or attenuation) of the amplifier to make the system output proportional to the system input at all settings of the amplifier. A refinement includes making correction for any offset or gain error introduced by the amplifier. Clearly, the overall accuracy of the system is unfavorably impacted by inaccurate knowledge of the gain and offset.

It is further well known that the gain and offset of even the most stable amplifier varies as a result of component aging and environmental factors. Thus, even highly accurate initial calibration of the gain-ranging amplifier is generally not adequate for high precision applications, and manual calibration is both time consuming and difficult. For such cases, there is a need for a simple and effective automatic (i.e., not manual) calibration system and method to permit measurement of the gain and offset of the gain ranging amplifier as required.

To this end, several systems have been devised. A common approach is to periodically introduce one or more known reference signals into the amplifier and compare the digitized output with a pre-established value. Alternatively, a digital-to-analog (D/A) converter and a feedback loop may be periodically incorporated between the output of the A/D converter and the input of the gain-ranging amplifier to permit measurement or adjustment of the gain and offset experienced by one or more reference signals passing through the system. Examples of such systems may be found in U.S. Pat. Nos. 4,143,361 and 4,342,983.

While such systems do indeed provide apparatus for compensating the gain and offset of the gain-ranging amplifier, it should be noted that such measurements are made using the A/D converter as an element of the measuring system, and are therefore limited by the converter's resolution. For a non-varying calibration signal, the A/D converter will provide an output signal no better than the least significant digit of the converter. As a consequence, the overall system accuracy will generally be considerably worse than that of a system having accurate gain and offset correction. This comes about since errors in the gain correction appear as a multiplicative factor whereas errors in the digitization alone and in the offset appear as additive factors.

Accordingly, it is an object of the present invention to provide a simple apparatus for and method of correcting the gain and offset drift of a gain-ranging amplifier to an accuracy greater than that set by the resolution of the A/D converter.

SUMMARY OF THE INVENTION

This object is met by of an apparatus, and method for its use, wherein a noise of known statistical properties is deliberately superposed on the set of reference signals used to calibrate the gain-ranging amplifier. The noise may be generated by any of a number of known means (e.g., a diode noise generator, a noisy transistor amplifier, or the like). The maximum amplitude variations of the noise about its mean average value is chosen to be greater than at least one, and preferably several times, the least significant digit value of the A/D converter at the lowest anticipated gain, and the reference DC signal levels are chosen to be spaced from the minimum and maximum output values or counts of the A/D converter at the lowest and highest anticipated gains by better than half the maximum noise amplitude. A time average of a series of measurements of the noisy reference signals as amplified and digitized by the system are obtained. Due to the impressed noise, the individual digitized measurements display a statistical distribution about the value of the least significant digit within which the mean value of the reference signal falls. By taking the statistical average of the individual digitized values, the system output corresponding to the reference signals may be determined to a greater accuracy than the resolution of the A/D converter. In this way, the gain and offset of the gain-ranging amplifier is determined with greater precision than is possible by using DC reference signals alone without the noise.

Other objects of the invention will in part be obvious and will in part appear hereinafter. The invention accordingly comprises the apparatus possessing the construction, combination of elements, and arrangement of parts and the method involving the several steps and the relation and order of one or more of such steps with respect to each of the others, as are exemplified in the following detailed disclosure, and the scope of the application of which will be indicated in the claims.

BRIEF DESCRIPTION OF THE DRAWING

For a fuller understanding of the nature and objects of the present invention, reference should be had to the following detailed description taken in connection with the accompanying drawing wherein a block diagram of a preferred embodiment of the present invention is shown interconnected with a typical prior art analog and digital electrical data processing system.

DETAILED DESCRIPTION OF THE INVENTION

Turning to the drawing, there may be seen a block diagram representing a preferred embodiment of the adaptive gain-ranging system of the present invention. Signal source 10 is connected, through selector switch 12 and selectable gain amplifier 14, to the input of analog-to-digital (A/D) converter 16. In turn, the output of A/D converter 16 provides a signal to data system 18 and thence to output device 20. The system further comprises control device 22, interconnected between various other components as will hereinafter be described in detail, and a calibration signal system in general designated by reference numeral 24, also connected to the input of A/D converter 16 through selector switch 12 and selectable gain amplifier 14. Power for the operation of the system is supplied, as appropriate, by one or more power supplies (not shown).

In greater detail, signal source 10 may be any one of a number of well-known electrical transducers that provide a variable electrical current or voltage responsive to a physical parameter. In this regard, signal source 10 may be, for instance, a photodetector, a piezoelectric strain gauge, a capacitive proximity detector, or the like, together with any required power supply, preamplier, impedance matching device, and the like, as well known in the art.

Selector switch 12 is any one of a number of devices for making an electrical connection between either of two electrical inputs and the switch's electrical output while simultaneously electrically disconnecting the other input. In the preferred embodiment, selector switch 12 is chosen so as to be activated by an appropriate electrical "mode set" signal from control device 22. In this case, selector switch 12 may be an electromechanical or solid state relay. However, it will be appreciated that in some applications selector switch 12 might be a manually manipulated device, such as one or more switches or connectors. Selector switch 12 is connected to receive input signals from signal source 10 and calibration signal system 24 and to connect them alternately to selectable gain amplifier 14.

Selectable gain amplifier 14 is chosen to provide (analog) output signals responsive to (analog) input signals at any one of a preselected plurality of nominal gains, the gain being selected by an appropriate gain set signal. While typically the preselected gains of selectable gain amplifier 14 are chosen to differ from one another nominally by powers of two, it will be appreciated that any two or more values of the preselected gain may be employed, and further that one or more of the preselected gains may be fractional (i.e., selectable gain amplifier 14 may provide attenuation). In the preferred embodiment, the gain is set in response to an electrical gain set signal from control device 22. For such an embodiment, the gain of the selectable gain amplifier may be established by opening, closing, or stepping an electromechanical relay or its solid state equivalent. However, as is the case of the operation of selector switch 12, it will be understood that in certain embodiments a manually manipulated device, such as a multi-tap switch, might be employed to select the value of the desired gain. Selectable gain amplifier 14 is connected between selector switch 12 and A/D converter 16 so as to provide a signal proportional to the signal received from the selector switch 12.

A/D converter 16 is any one of a number of well-known devices for periodically providing digitally (commonly binary) encoded electrical signals responsive to the current or voltage of an input signal. The output of A/D converter 16 serves as an input (directly or through telemetry) to data system 18, which preferably is a dedicated data system capable of storing, comparing, and otherwise manipulating digital information. Thus, data system 18 is preferably an electronic computer programmed, as taught by the prior art, to accumulate and process the output of A/D converter 16 into a form useful to the user, depending on the nature of the system and signal source 10. In its simplest form, data system 18 might thus be programmed only to correct the data by the last known values of the gain and offset, e.g., by dividing by the gain and adding the offset.

Typically, data system 18 is connected to an output device 20 so that the raw data from A/D converter 16, or the result of its manipulation or comparison with previously stored data, may be displayed or permanently recorded. To this end, output device 20 is typically a display system, printer, recorder, or the like.

Control device 22 is any one of a number of devices for providing a sequence of control signals on command. Thus, control device 22 may be an electromechanical sequence controller, tape or card actuated switching gear, or the like. In the preferred embodiment, control device 22 is a signal conditioner providing a set of appropriate electrical signals responsive to signals from data system 18. It will be understood, however, that control device 22 might also be a manually operated device, such as a set of switches. Control device 22 is connected to a power supply (not shown) so as to provide control signals to selector switch 12, selectable gain amplifier 14, and calibration source system 24.

Calibration source system 24 includes selectable bias source 26, noise source 28, and summing amplifier 30.

Selectable bias source 26 is any one of a number of devices for providing any selected constant level reference signal from a set of pre-established DC signal levels. Thus, selectable bias source 26 may be a voltage divider network and a precision power supply, a set of standard cells, or the like, that may be variously connected to provide a selected reference signal. In the preferred embodiment, the selection of the bias level is responsive to a bias set signal from control device 22. To this end, as well known, solid state or electromechanical relays or the like may be used to interconnect components so as to provide the desired signal levels. However, it will also be understood that the selection of reference signals might also be done manually. In a preferred embodiment, the selected output signal from selectable bias source 26 is provided as one of the inputs to summing amplifier 30.

In a preferred embodiment, noise source 28 is connected as the other input of summing amplifier 30. Noise source 28 is any one of a number of well-known devices for producing an electrical noise of known statistical properties. Thus, noise source 28 may be a diode noise generator, a noisy amplifier, or the like. Preferably, but not necessarily, noise source 28 is chosen to produce a Gaussian (or nearly Gaussian) noise spectrum which, as well known, exhibits amplitude variations having a mean average of zero over time. In any event, as will become apparent hereinafter, the operation of the invention is simplified if the probability distribution of the noise is symmetric.

Summing amplifier 30 is preferably a conventional unity-gain amplifier capable of superposing a pair of signals. Its output, corresponding to the sum of the signals it receives from selectable bias source 26 and noise source 28, is connected as an input to selector switch 12.

Concerning the overall system parameters of calibration signal system 24, noise source 28 is selected so as to produce a noise signal having maximum amplitude variations about its mean average value. The noise signal has a maximum amplitude, when amplified at the lowest gain of selectable gain amplifier 14, that is greater than at least one, and preferably several times, the least significant digit value of A/D converter 16, while preferably remaining less than half the counting range i.e., less than half the value between the minimum and maximum output values, of the converter at the highest gain of the selectable gain amplifier. The minimum and maximum reference signal levels of selectable bias source 26 are chosen such that, when amplified by selectable gain amplifier 14 at minimum and maximum gain respectively, they correspond to output signals of A/D converter 16 spaced from the minimum and maximum output values or counts by better than half the maximum noise amplitude produced by noise source 28. It will be understood that for a truly Gaussian signal, the maximum amplitude of the noise signal may be generated within any convenient range, say six standard deviations. However, the requirement remains that at the lowest gain of the gain-ranging amplifier the amplitude of the noise signal covers at least one—and preferably several times—the least significant digit as digitized by the A/D converter in a relatively small number of counting cycles, yet the noise signal does not the range of the converter at the highest gain a significant number of times in a relatively large number of counts).

The operation of the preferred embodiment will now be described. Normally, selector switch 12 is positioned to connect signal source 10 to selectable gain amplifier 14 (disconnecting calibration source system 24), and selectable gain amplifier 14 is set at a predetermined nominal gain. Signals from signal source 10, amplified accordingly, are supplied as input to A/D converter 16. As a result, a train of digital signals spaced apart by the sampling time of the A/D converter is supplied to data system 18. In the preferred embodiment, as in prior art devices, data system 18, inter alia, compares the signals from A/D converter 16 with pre-established limit signals (stored, for instance, in a look-up table), and supplies control device 22 with an appropriate up or down signal respectively as the count falls below or exceeds the pre-established lower or upper limits. In response, control device 22 generates appropriate gain set signals and supplies them to selectable gain amplifier 14, stepping the gain up or down. This process continues until the digitized signal from A/D converter 16 is within the pre-established limits. Thereafter, data is collected, processed, and disposed of as required by the nature of the overall system.

Throughout the cycling of selectable gain amplifier 14, it will be understood that the nominal value of the selected gain is somehow recorded, as on a counter, in data system 18 responsive to the up and down signals. Data system 18 may thus present to output device 20 a digital output, updated as desired, corresponding to the signal from signal source 10, as amplified by selectable gain amplifier 14, together with an indication of the nominal gain setting of the amplifier. Alternatively, as will be understood by those skilled in the art of computer-assisted instrumentation systems, data system 18 might apply (as from a look-up table) the last known values of the gain and offset corresponding to the gain setting, thereby supplying output device 20 a corrected sequence of data.

In response to signals from data system 18, control device 22 also provides a sequence of signals to selector switch 12, selectable gain amplifier 14, and calibration source system 24, thereby interposing a calibration test. This sequence may be initiated by data system 18 in response to either a previously established program (e.g., an instruction to initiate a calibration sequence at fixed time intervals, after cycling selectable gain amplifier 14 a pre-set number of times, or the like), a user command, or the like. At the same time that the calibration sequence is initiated, the gain-ranging function of data system 18 described supra is inhibited. In the calibration sequence, control device 22 preferably first resets selectable gain amplifier 14 to the lowest gain and selectable bias source 26 to the lowest bias. Control device 22 then sets selector switch 12 to connect calibration source system 24 to the input of the selectable gain amplifier, disconnecting signal source 10 at the same time. As a consequence, the lowest level DC calibration signal, with superposed noise due to noise source 28, is supplied to A/D converter 16 at the lowest nominal gain of selectable gain amplifier 14. Data system 18 now accumulates in memory a series of digital signals corresponding to this bias and gain. Alternatively, this information may be recorded by output device 20. Unlike data accumulated from signal source 10, these digital signals are not manipulated according to the function of the system, nor are they corrected by applying the last known gain and offset values corresponding to the gain set.

When a statistically significant number of samples of digital signals is collected, control device 22 generates a bias set signal resetting the bias of selectable bias source 26 to the highest level calibration signal, and data system 18 accumulates another series of digital signals. In a like manner, control device 22 generates gain set and bias set signals to step selectable gain amplifier 14 through its preselected gains, supplying minimum and maximum calibration signals for each gain setting. Data system 18 accumulates a set of signals for each calibration level at each gain setting.

Since the maximum amplitude of the noise generated by noise source 28 has been selected to be greater than the resolution of A/D converter 16 at the minimum gain of selectable gain amplifier 14, each series of digital signals produced during the calibration sequence will evidence scatter. Since the levels of the DC calibration signals have been selected, in view of the gains of selectable gain amplifier 14, to correspond to digital signals displaced from the limits of A/D converter 16 by counts greater than half the maximum amplitude of the noise signal, virtually all of the sample counts of each digital signal series will be within the counting limits, i.e., the maximum and minimum values of the converter.

The time or mean average of each series of digital signals will be a value corresponding to the noise-free value of the corresponding calibration signal at the gain in question, since, preferably, the time average value of the noise signal is zero. The accuracy of this average depends upon the number of individual values of the digital signal averaged and upon the statistical behavoir of the noise, and may be deduced by an analysis of the particular system parameters and noise source. Absent a detailed analysis, it is evident that the number of significant figures in this average easily exceeds that obtainable from observations of a noise-free calibration source. In particular, for a Gaussian noise, it may be shown that the accuracy of the average increases inversely as the square root of the number of independent values or samples entering into the average. Consequently, at moderate data rates and over reasonable time periods, values of gain and offset, one or two orders of magnitude more accurate than the A/D converter resolution, are readily obtainable.

The average values of the series of digitized calibration signals correspond to zero-point and scale (offset and gain) values of the various gain settings. The gain and offset may be directly determined therefrom, as by data system 18 or manually. These new values may be recorded or used to update a correction look-up table in data system 18.

At the end of the calibration sequence, control device 22 resets selectable gain amplifier 14 to the initial predetermined nominal gain and resets selector switch 12 so as to reconnect signal source 10 to the selectable gain amplifier while simultaneously disconnecting calibration source system 24. The data system is simultaneously returned to its normal data collection mode.

It will be appreciated that details of both the apparatus and method described above may be altered without departing from the scope of the invention. Thus, as previously indicated, controller 22 may be an electromechanical sequence controller or an extension of a general purpose computer. Further, the various control functions may be, if desired, performed manually.

Then too, it will be understood that noise source 28 need not be a separate device, but might, for instance, be incorporated into selectable bias source 26. Thus, selectable bias source 26 might incorporate a stage of amplification with a noisy amplifier. It will be appreciated that, in cases where noise source 28 is incorporated into selectable bias source 26, summing amplifier 30 may be dispensed with, the selectable bias source being directly connected to selector switch 12.

It will also be appreciated that the averaging of the calibration signals may be performed by data system 18, and that weighted averaging might be employed, for instance, for noise sources having nonsymmetrically distributed noise spectra. It will also be understood that the results of each calibration run might be automatically incorporated into subsequent data processing by data system 18, and that further, the individual digital signals corresponding to each train of a calibration run might simply be passed through data system 18 to output device 20 for subsequent analysis.

Since these and other changes may be made in the above apparatus and method without departing from the scope of the invention herein involved, it is intended that all matter contained in the above description or shown in the accompanying drawing shall be interpreted in an illustrative and not a limiting sense.

What is claimed is:

1. Apparatus for calibrating an amplifier coupled to the input of an analog-to-digital signal converter having an established dynamic range and output resolution, said apparatus comprising:
    means for generating a plurality of reference signals each of a predetermined amplitude;
    means for adding to each of said reference signals a noise signal having (a) maximum amplitude variations about its average value exceeding the resolution of said converter, and (b) a statistically predetermined average amplitude over time, so as to provide a plurality of noisy reference signals having maximum amplitude variations about its average value within the dynamic range of said converter;
    means for applying each of said noisy reference signals to the input of said amplifier so as to generate a calibration signal as a function of the actual gain of said amplifier in response to each of said noisy reference signals; and
    means for averaging the values of said calibration signals for each of said nominal gain settings so as to provide an average signal as a function and representative of the actual gain of said amplifier.

2. Apparatus according to claim 1, further including means for receiving data signals from a source of said data signals, wherein said means for applying each of said noisy reference signals to the input of said amplifier includes means for selectively applying said data signals and said noisy reference signals to the input of said amplifier.

3. Apparatus according to claim 2, wherein said means for applying includes a selector switch for selectively applying said data signals and said noisy reference signals to the input of said amplifier.

4. Apparatus according to claim 1, wherein the amplitudes of said plurality of reference signals and said noise signals are such that said plurality of modified reference signals differ from one another sufficiently to produce, when amplified by said amplifier, a plurality of output signals of said converter within the dynamic range and spaced apart by at least the resolution of said converter.

5. Apparatus according to claim 4, wherein said means for adding said noise signal includes means for generating a noise signal having an average amplitude of zero over time.

6. Apparatus according to claim 5, wherein said means for generating said noise signal generates a random noise signal.

7. Apparatus according to claim 6, wherein said means for averaging said calibration signals includes means for storing the output signals of said converter in response to each of said modified reference signals.

8. Apparatus for calibrating a gain-ranging amplifier
    (1) coupled to the input of an analog-to-digital signal converter having an established dynamic range and output resolution, and
    (2) adapted to be set to provide at least two nominal signal gains including a maximum signal gain for relatively small input signals to said amplifier and a minimum signal gain for relatively large input signals to said amplifier so that the digital signal output of said converter and the gain of said amplifier can represent input signals to said amplifier having a greater dynamic range than the dynamic range of said converter, said apparatus comprising:
    means for generating for each of said nominal signal gain settings of said amplifier a plurality of reference signals each of a predetermined amplitude;
    means for adding to each of said reference signals a noise signal having (a) maximum amplitude variations about its average value exceeding the resolution of said converter at said minimum gain setting, and (b) a statistically predetermined average amplitude over time, so as to provide a plurality of noisy reference signals having maximum amplitude variations about its average value within the dynamic range of said converter at the corresponding nominal gain setting of said amplifier;
    means for applying each of said noisy reference signals to the input of said amplifier set to provide the corresponding nomimal signal gain so as to generate a calibration signal as a function of the actual gain of said amplifier in response to each of said noisy reference signals; and
    means for averaging the values of said calibration signals for each of said nominal gain settings so as to provide an average signal as a function and representative of the actual gain of said amplifier for each of said gain settings.

9. Apparatus according to claim 8, further including means for receiving data signals from a source of said data signals, wherein said means for applying each of said noisy reference signals to the input of said amplifier includes means for selectively applying said data signals and said noisy reference signals to the input of said amplifier.

10. Apparatus according to claim 9, wherein said means for applying includes a selector switch for selectively applying said data signals and said noisy reference signals to the input of said amplifier.

11. Apparatus according to claim 8, wherein the amplitudes of said plurality of reference signals and said noise signals are such that said plurality of modified reference signals differ from one another sufficiently to produce, when amplified by said amplifier at said minimum gain, a plurality of output signals of said converter within the dynamic range and spaced apart by at least the resolution of said converter.

12. Apparatus according to claim 11, wherein said means for adding said noise signal includes means for generating a noise signal having an average amplitude of zero over time.

13. Apparatus according to claim 12, wherein said means for generating said noise signal generates a random noise signal.

14. Apparatus according to claim 13, wherein said means for averaging said calibration signals includes means for storing the output signals of said converter together with the gain setting of said amplifier in response to each of said modified reference signals at each of said gain settings.

* * * * *